(12) United States Patent
Randlett

(10) Patent No.: US 7,382,191 B2
(45) Date of Patent: Jun. 3, 2008

(54) MULTIPLIER-TRANSIMPEDANCE AMPLIFIER COMBINATION WITH INPUT COMMON MODE FEEDBACK

(75) Inventor: Richard Randlett, Palo Alto, CA (US)

(73) Assignee: Sipex Corporation, Fremont, CA (US)

( * ) Notice: Subject to any disclaimer, the term of this patent is extended or adjusted under 35 U.S.C. 154(b) by 23 days.

(21) Appl. No.: 11/356,597

(22) Filed: Feb. 17, 2006

(65) Prior Publication Data

US 2007/0194846 A1    Aug. 23, 2007

(51) Int. Cl.
    *H03F 3/45* (2006.01)
(52) U.S. Cl. ................ 330/254; 330/261

(58) Field of Classification Search ........... 330/254, 330/257, 260, 261; 327/359
See application file for complete search history.

(56) References Cited

U.S. PATENT DOCUMENTS 5,432,474 A *  7/1995  Lauffenburger et al. .... 330/252
6,313,458 B1 * 11/2001  Okamoto ................ 250/214 A
6,501,775 B2 * 12/2002  Taguchi et al. .......... 372/38.02

\* cited by examiner

*Primary Examiner*—Henry Choe
(74) *Attorney, Agent, or Firm*—Fliesler Meyer LLP

(57) ABSTRACT

A current mirror is used to bias an amplifier which is connected to a multiplier.

20 Claims, 3 Drawing Sheets

MULTIPLIER-TRANSIMPEDANCE AMPLIFIER COMBINATION WITH INPUT COMMON MODE FEEDBACK

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

FIELD OF THE INVENTION

The invention relates generally to electrical signal amplifier circuits, and more particularly to electrical signal amplifier circuits with photodiodes.

BACKGROUND

Electrical signal amplifier circuits with photodiodes can be used for a number of application such as in digital versatile disc (DVD) players, and in compact disc (CD) players, and for many other applications that require a wide dynamic range of gains while maintaining circuit bandwidth. This has been attempted by, among other approaches, placing a multiplier ahead of a conventional transimpedance amplifier.

BRIEF DESCRIPTION OF THE DRAWINGS

Preferred embodiment(s) of the present invention will be described in detail based on the following figures, wherein.

DETAILED DESCRIPTION

Figure 1:
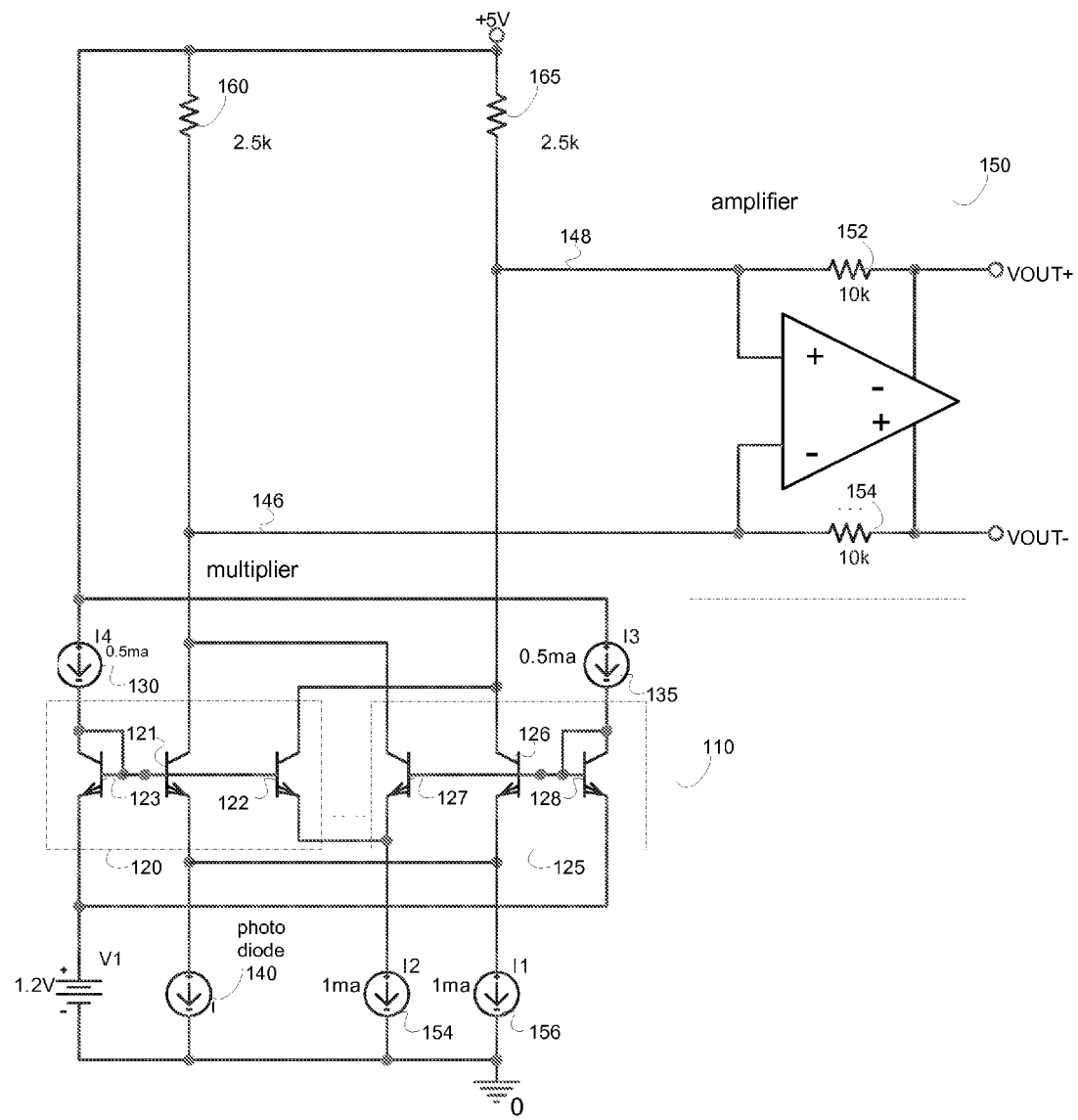
FIG. 1 is an example of a multiplier/amplifier circuit.

FIG. 1 shows a multiplier 110, such as a 6-transistor Gilbert cell fractional multiplier, which can consist of cross-coupled differential amplifier 120 and cross-coupled differential amplifier 125. Differential amplifier 120 can comprise transistors 121, 122, and 123. Differential amplifier 125 can comprise transistors 126, 127, and 128. Differential amplifier 120 can be controlled by balanced-differential current source 130, while differential amplifier 125 can be controlled by balanced-differential current source 135. Balanced-differential current sources 130 and 135 can be controlled by an external potentiometer (not pictured). Current sources 154 and 156 can be placed in parallel with a photodiode 140. The amplifier 150 can include feedback resistors 152 and 154.

In one embodiment, because of the cross-coupling of the multiplier, when the current injected by photodiode 140 is zero, even if balanced-differential current sources 130 and 135 are generating different currents, no net change in differential current occurs at the outputs 146 and 148 of the multiplier 110 as long as current sources 154 and 156 are generating equal currents. Conversely, when balanced-differential current sources 130 and 135 are generating equal currents, any photocurrent injected by photodiode 140 will be divided equally between transistors 121 and 126. The photocurrent will appear as a common-mode signal at the outputs 146 and 148 (which are also the inputs of the amplifier 150) of the multiplier 110. The net output of multiplier 110 is defined as the difference between outputs 146 and 148. The net output equals the product of the photocurrent from the photodiode 140 times the difference between the currents generated by current sources 154 and 156.

In order to provide proper biasing, the standing output current of the multiplier can be provided through resistors 160 and 165, setting the common mode voltage at the inputs of the amplifier 150. The gain of the multiplier 110 is approximately one.

Several problems and performance limitations are associated with the architecture shown in FIG. 1. Due to the aforementioned biasing restrictions, the feedback factor (Beta) of the TIA 150 is higher than ideal, with a typical value being approximately ⅕. Therefore, the output offset voltage, offset voltage drift and output noise associated with the amplifier 150 are each approximately five times the values associated with the inputs 146 and 148 of the amplifier 150. Because the open-loop gain is lower than optimum, it would be necessary use a more complex amplifier in order to raise the open-loop gain to acceptable levels. However, attempting to increase Beta by increasing the resistances of resistors 160 and 165 can result in 1) an unacceptable displacement of the input common mode voltage and 2) a high transient input common mode voltage swing when the multiplier is set at low fractional gains. Achieving closed-loop bandwidths greater than approximately 100 MHz is at best problematic using the architecture of FIG. 1.

Figure 2:
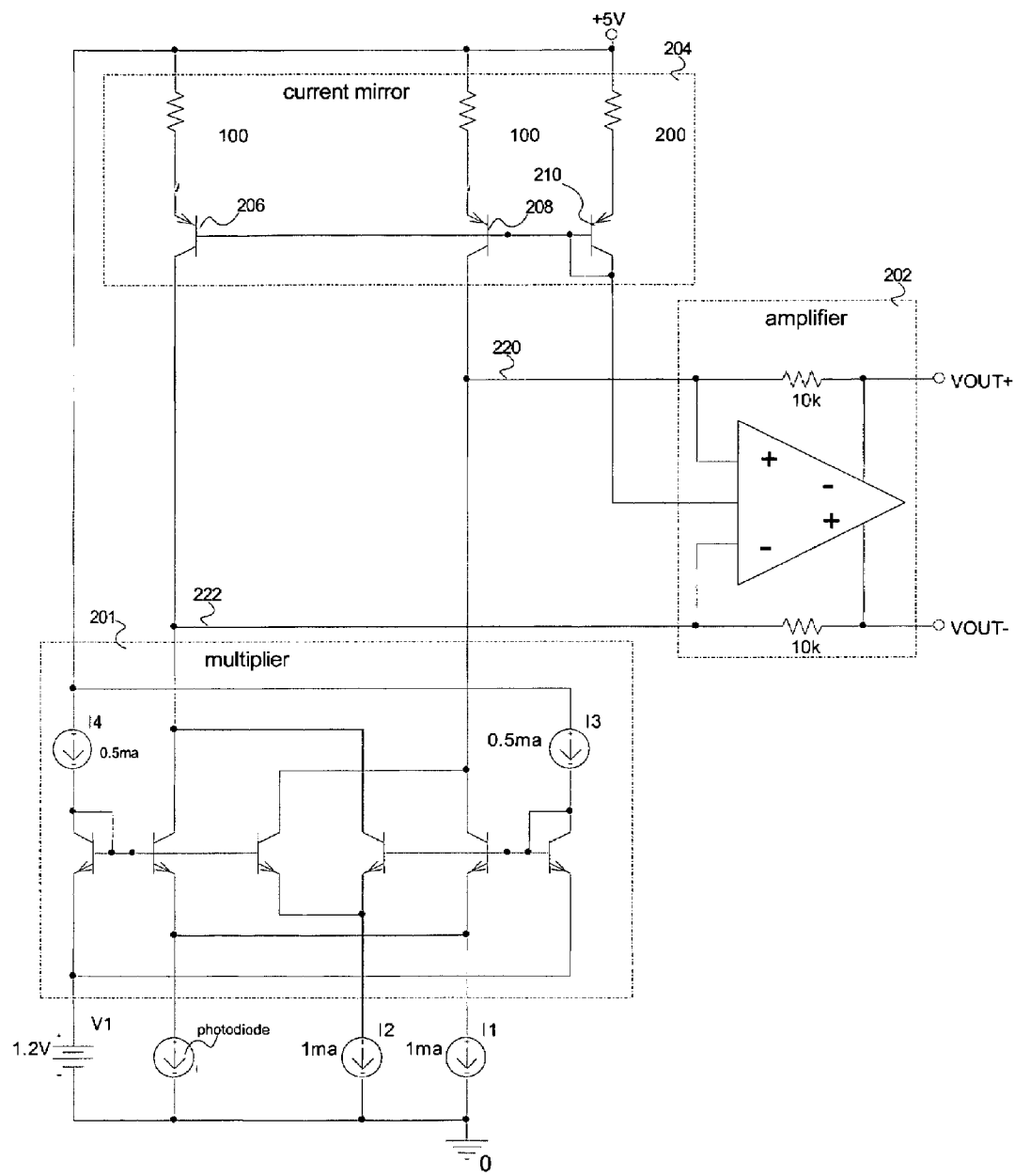
FIG. 2 is an improved multiplier/amplifier circuit of one embodiment.

One embodiment of the circuit of the present invention shown in FIG. 2 includes a multiplier 201 such as a Gilbert cell, operably connected to an amplifier 202 such as a transimpedance amplifier. The output nodes 220 and 222 of the multiplier are connected as inputs to the amplifier 202. Rather than using resistors to bias the amplifier 202, a current mirror 204 can be used. The current mirror 204 can use feedback from the amplifier 202 to set the bias for the amplifier 202.

The input common mode voltage at the amplifier stage can be sensed by the current mirror 304 and a current can be fed back to set the input common mode voltage equal to the output common mode voltage.

In one embodiment, a current mirror 204 is used rather than the resistors 160 and 165 of FIG. 1. This can reduce the voltage excursion at the input to the amplifier 202. In the example of FIG. 2, the current mirror 204 can have three transistors 206, 208, 210 whose bases can be connected to a node, such as a common mode feedback node, of the amplifier 202. In one embodiment, the collector of transistors 210 is connected to the bases of the transistors 206, 208 and 210 and to a node in the amplifier 202 that can provide feedback that allows for improved operation of the amplifier.

Due to input common mode feedback, the common-mode voltage excursion at the input to the amplifier 202 can be is limited to less than 100 mv, allowing a wide dynamic range of gain settings on the multiplier.

The amplifier 202 now can operate at a closed-loop gain of one, thereby minimizing offset and offset drift RTO while maximizing loop gain and closed-loop bandwidth. The result is excellent DC stability at maximum bandwidth over the entire range of multiplier gain settings.

Figure 3:
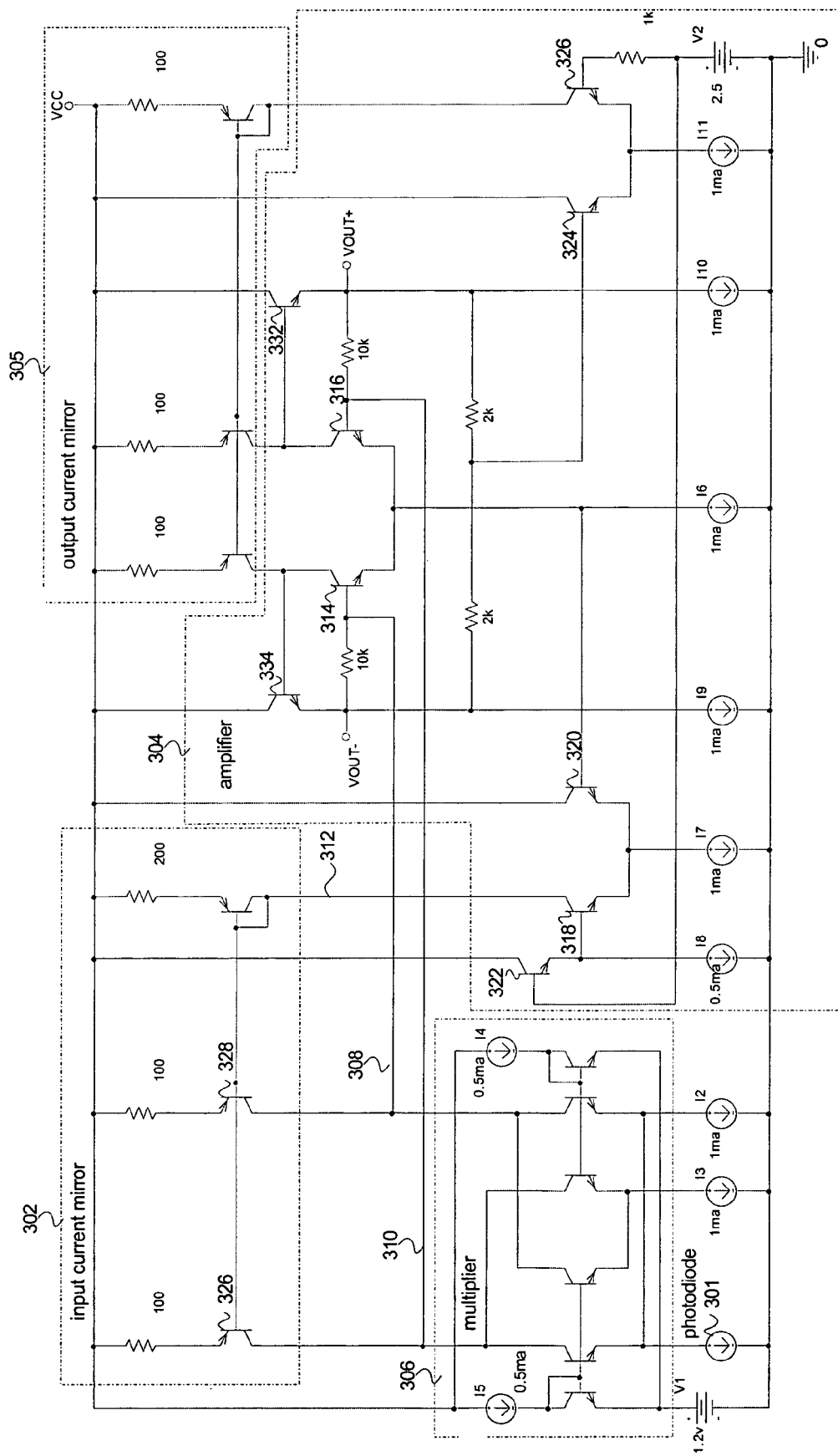
FIG. 3 illustrates details of one example of a multiplier/amplifier circuit.

FIG. 3 shows details of the circuit of one embodiment. FIG. 3 includes a current mirror 302, and amplifier 304 and a multiplier 306. The output nodes 308 and 310 of the multiplier 306 are connected as inputs to the amplifier 304 and to the current mirror 302. The common node feedback node 312 is connected to the amplifier 304 to provide feedback to the current mirror 306.

Absent any signal current from the photodiode 301, the bases of transistors 314 and 316 of amplifier 304 sit at 2.5V. This voltage is established by the input common mode loop consisting of differential pair transistors 318 and 320, and emitter follower 322. Current mirrors 302 and 305 can also uses V2 as a reference.

The multiplier 306 can be traditional 6 transistor transconductance multiplier. If currents I4 and I5 are equal (multiply by zero), any signal current, from diode 301, is equally divided by the multiplier differential pairs and no differential signals is seen at the bases. However, a large common mode signal will appear at the bases of transistors 314 and 316 of the amplifier 304 and adjusted to maintain approximately 2.5V common mode at the bases of transistors 314 and 316. As a difference current is established between transistors I4 and I5 the signal current from photodiode 301 will be split unevenly between the multiplier differential pairs and a difference current, in combination with a common mode current, will appear at the bases of transistors 314 and 316. The difference current is converted to a differential output voltage at the emitters of transistors 332 and 334. The residue common mode current is taken up by the input common mode loop and the common mode output voltage is maintained at 2.5V by the output common mode loop.

The amplifier is allowed to operate with a gain of 1. This maximizes bandwidth, minimizes noise and minimizes output voltage drift.

Due to the use of input common mode feedback, the common-mode voltage excursion at the input to the amplifier 304 is limited to a full range of not more than approximately 200-300 mV, allowing a wide dynamic range of gain settings on the multiplier. The amplifier stage operates at a closed-loop gain of one, thereby minimizing offset voltage and offset drift while maximizing loop gain and closed-loop bandwidth. The result is excellent direct current stability at maximum bandwidth over the entire range of multiplier gain settings.

Bandwidth is maximized, noise is minimized, offset is minimized, and offset drift is minimized. This enables us to build a very fast multiplier gain control device for controlling laser power.

According to one set of embodiments, the circuit can also comprises an output common mode regulation loop to provide true differential-in/differential-out operation.

As shown in FIG. 3, an output current mirror 305 can be connected to the amplifier output.

The foregoing description of the present invention has been provided for the purposes of illustration and description. It is not intended to be exhaustive or to limit the invention to the precise forms disclosed. Many modifications and variations will be apparent to the practitioner skilled in the art. Particularly, it will be evident that the above-described features of detecting and ranking images with numerical ranks in order of usefulness based on vignette score can be incorporated into other types of software applications beyond those described. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

What is claimed is:

1. A circuit capable of amplifying an electrical signal comprising:
    a) a multiplier capable of receiving and multiplying two input electrical signals so as to produce an amplifier input signal, wherein the amplifier input signal comprises an input common mode voltage;
    b) an amplifier capable of receiving the input signal from the multiplier stage and of amplifying the input signal; and
    c) a current mirror configured to bias the amplifier input; wherein the current mirror uses feedback from the amplifier to set a bias for the amplifier.

2. The circuit of claim 1, wherein the current mirror maintains the input common mode voltage at an approximately constant level.

3. The circuit of claim 1, wherein the multiplier is a Gilbert cell.

4. The circuit of claim 1, wherein the gain/feedback factor/Beta of the amplifier is approximately equal to unity.

5. The circuit of claims 1, wherein multiplier has two outputs that are connected to the amplifier and to the current mirrors.

6. The circuit of claim 1, wherein the amplifier stage is a transimpedance amplifier.

7. The circuit of claim 1, wherein the full scale variation over time of the input common mode voltage does not exceed approximately three hundred millivolts.

8. The circuit of claim 1, further comprising a photodiode which produces at least one input to the multiplier stage.

9. The circuit of claim 1, wherein the output of the amplifier is used in a laser-based device.

10. The apparatus of claim 7, wherein the laser-based device is a compact disc (CD) drive.

11. The apparatus of claim 7, wherein the laser-based device is a digital versatile disc (DVD) drive.

12. The circuit of claim 1, wherein the current mirror is connected to the multiplier stage.

13. The circuit of claim 1, wherein the current mirror is connected to the amplifier stage.

14. A circuit capable of amplifying an electrical signal comprising:
    a multiplier capable of receiving and multiplying two input electrical signals so as to produce an amplifier input signal, wherein the amplifier input signal comprises an input common mode voltage;
    an amplifier capable of receiving the input signal from the multiplier stage and of amplifying the input signal;
    a current mirror configured to bias the amplifier input; and
    an output common mode regulation loop connected to outputs of the amplifier, wherein said output common mode regulation loop is configured to reduce the magnitude of the difference between the output common mode voltage and the input common mode voltage.

15. The apparatus of claim 1, wherein the current mirror includes a number of transistors connected to the amplifier stage.

16. The apparatus of claims 15, wherein the base of one of the transistors of the current mirror is connected to a node in the amplifier stage.

17. A circuit comprising:
    a photodiode;
    a gilbert cell operably connected to the photodiode;

a two-input amplifier operably connected to two outputs of the gilbert cell; and a feedback unit to bias the two inputs of the amplifier, the feedback unit receiving a feedback input from a feedback node in the amplifier.

18. The circuit of claim 17, wherein the feedback unit is a current mirror.

19. The circuit of claim 17, wherein the feedback unit maintains the input common mode voltage at an approximately constant level.

20. The circuit of claim 17, wherein a current is fed back to set the input common mode voltage of the amplifier equal to the output common mode voltage of the amplifier.

* * * * *